United States Patent [19]

Couch et al.

[11] Patent Number: 4,801,982

[45] Date of Patent: Jan. 31, 1989

[54] ELECTRONIC DEVICES

[75] Inventors: Nigel R. Couch, Pinner Green; Michael J. Kelly, Hampstead; Peter H. Beton, Wandsworth, all of England

[73] Assignee: The General Electric Company, p.l.c., England

[21] Appl. No.: 99,060

[22] Filed: Sep. 21, 1987

[30] Foreign Application Priority Data

Sep. 26, 1986 [GB] United Kingdom ............... 8623208

[51] Int. Cl.⁴ .................. H01L 27/26; H01L 47/00; H01L 47/02; H01L 27/12
[52] U.S. Cl. ........................................... 357/3; 357/4; 357/16; 357/58
[58] Field of Search ............. 357/3, 4, 16, 58

[56] References Cited

U.S. PATENT DOCUMENTS 4,539,581 9/1985 Malik et al. ........................ 357/3
4,649,405 3/1987 Eastman ............................ 357/3

Primary Examiner—Eugene R. Laroche
Assistant Examiner—Michael B. Shingleton
Attorney, Agent, or Firm—Kirschstein, Kirschstein, Ottinger & Israel

[57] ABSTRACT

A Gunn effect oscillator comprises a body of semiconductor material in which electrons are injected from one region to another region via a very thin intervening system. The thin region has a thickness which is less than the mean free electron path length and is typically of the order of 100 Å, which results in hot electrons being transferred from the injection region into the other region in which electron bunches form.

4 Claims, 1 Drawing Sheet

ELECTRONIC DEVICES

BACKGROUND OF THE INVENTION

1. Field of the Invention

This invention relates to electronic devices. In particular the invention relates to electronic devices employing the Gunn effect to produce coherent electronic oscillations.

2. Description of Related Art

Such devices have been known for a number of years, and typically comprise a quantity of a Gunn effect material, for example a material such as GaAs having two conduction bands of different curvatures, together with means for injecting electrons into the quantity. By application of an electric field of sufficient magnitude across the quantity, the electrons injected into the quantity may be excited from the lower to the upper conduction band. As the electrons within the upper conduction band will have a higher effective mass than those in the lower band, they will have a lower mobility than the electrons in the lower band. Thus, as these lower mobility electrons drift across the quantity, along the electric field gradient, they will form bunches amongst the higher mobility electrons, these bunches being known as domains. Since only one domain will be formed within the quantity at any one time, the output of the device will comprise a series of current pulses, whose frequency is dependent on the length of the quantity through which the domains drift, i.e. the transit region of the device.

Such a device suffers the disadvantage however that it is difficult to define the exact length of the transit region, due to the fact that it is difficult to control the region where the excitation of the electrons from the lower to the upper conduction band takes place, this imprecision causing noise in the output signal of the device. Furthermore the "dead space" within the quantity of Gunn effect material in which the energy of the electrons is insufficient to enable them to be excited into the upper conduction band causes parasitic resistance in the device. Attempts have been made to overcome these problems by using a material for the charge injection region which has a sufficiently large band gap offset to that of the Gunn material that the electrons injected into the quantity of Gunn material have nearly all the energy required to excite them into the upper conduction band at the injector material/Gunn material interface. Such a device suffers the problem however that there will be a relatively wide depletion region within the quantity of Gunn material adjacent to the injection region.

SUMMARY OF THE INVENTION

It is an object of the present invention to provide an electronic oscillator utilising the Gunn effect wherein the above difficulties are, at least, alleviated.

According to the present invention an electronic device comprises: a charge injection region and first and second regions of a Gunn effect material, the charge injection region being effective in use of the device to inject charge of a predetermined energy which is less than the energy difference between the minima of the pair of energy band edges rise to the Gunn effect in said Gunn effect material into said first region, the first region having a thickness which is not more than the mean free electron path length in said first region, and being doped to an extent that in use of the device the sum of the depletion energy in the first region and said predetermined energy is in the order of said energy difference, the second region being doped to a lesser extent than said first region such that the electric field across the second region is sufficient for the formation and propagation of domains.

The mean free electron path length in said first region is primarily that due to scattering from the lower to the upper conduction band of the material, and is typically of the order of 200 Å.

The charge injection region suitably comprises a graded gap injector the composition of the charge injection region being the same as said first and second regions at its edge remote from said first and second region, and varying in the direction towards said first region such that the direct band gap increases linearly with distance from edge remote from said first and second regions, and so that it forms a heterojunction with said first region.

Other structures could be used for the charge injection region. The common feature of such structures is that under external bias they will accelerate electrons over a short distance (less than the mean free path for scattering within the lower conduction band, typically 1000 Å) to a specified energy h which is determined by considerations referred to subsequently.

As an alternative to the graded gap injector a planar doped barrier could be used for the charge injection region. Such a structure consists of a selectively doped region of semiconductor material which would be the same material as that used for the Gunn effect region. The type and amount of doping in such a structure are chosen so that under bias an appropriate electric field is generated to accelerate electrons according to the requirements discussed above.

Said Gunn effect material is suitably GaAs.

BRIEF DESCRIPTION OF THE DRAWINGS

One electronic device in accordance with the invention will now be described by way of example only, with reference to the accompanying figures in which.

DETAILED DESCRIPTION OF THE PREFERRED EMBODIMENT

Figure 1:
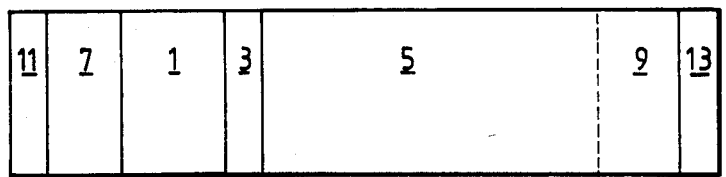
FIG. 1 is a schematic side view of the device, the electron energy levels of the various regions of the device also being indicated in the figure.
Figure 1:
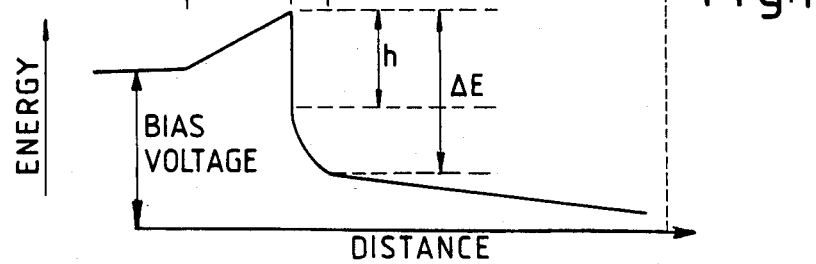

Referring firstly to FIG. 1, the device comprises a layer of $Al_xGa_{1-x}As$ 1 where x is 0 at one edge of the layer, and varies linearly over the width of the layer to a maximum value of 0.3 at the other side of the layer, this layer being of a few 100 Å thickness. The direct band gap of $Al_{1-x}Ga_xAs$ varies linearly with x. Adjacent to the layer 1, at its edge where x is equal to 0.3 there is provided a thin layer of GaAs 3 of approximately 100 Å thickness, this layer being doped with Si to a level of $10^{18} cm^{-3}$. At the side of the layer 3, remote from the layer 1 there is provided a further 1 μm thick layer of GaAs, this being lightly doped with Si to a level of $2 \times 10^{16} cm^{-3}$. At the free edges of the layers 1, 5 there are provided respective capping layers of GaAs 7, 9 these both being heavily doped with Si to a level of $5 \times 10^{18} cm^{-3}$. Respective metal contact layers 11, 13 are provided on the capping layers 7, 9.

In use of the device with an appropriate electrical bias applied across the device by means of the contact layers 11, 13, the layer 1 constitutes an electron injector, injecting electrons into the GaAs layer 3 at an energy h above the energy of the lower conduction band of the layer 3. The energy gap h is chosen to be less than the intervalley separation $\Delta E$ between the two conductive bands in each of the GaAs layers 3 and 5, the concentration doping of the layer 3 being set such that the sum of the depletion voltage within the layer 3 adjacent to the heterojunction formed at the interface between the layers 1 and 3, together with the energy h is of the order of $\Delta E$. Thus the region of intervalley transfer of electrons from the lower to the upper conduction band with the regions of GaAs in the device is set within one mean free path, ~200 Å, of the interface between region 3 and 5, the layer 5 taking the form of a transit region across which the lower mobility domains drift, the length of the layer 5 thus determining the frequency of the current pulses forming the output of the device.

Figure 2:
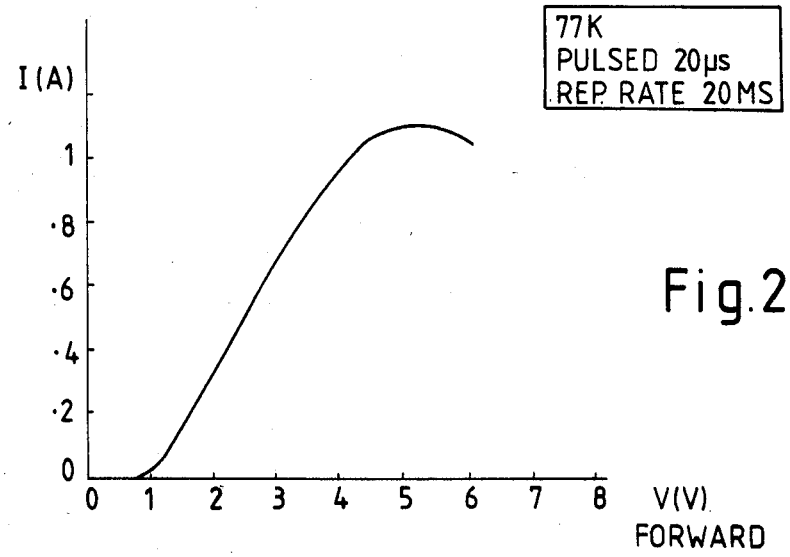
FIG. 2 is the DC current voltage characteristic of the injection region of the device of FIG. 1.

FIG. 2 shows the DC current voltage characteristic of the injection region 1 of the above device a region of negative differential resistance being evident for bias voltages in excess of 5 volts, such negative differential resistance together with the further regions of Gunn effect material leading to the required oscillatory output of the device as described above.

It will be appreciated that whilst particular layer widths and doping levels have been specified in the device described above by way of example, these may readily be varied. Generally however the thickness of the injector region 1 will be greater than 50 Å to prevent tunnelling of the potential barrier constituted by the graded composition of the layer 1. Electro-migration and other lifetime effects will determine the necessary thickness of the layer. The thickness of the layer 3 must be less than that of the mean free path for intervalley scattering between the two conduction bands in GaAs, but must be thicker than the depletion region within the layer 3 caused by the adjacent injector region 1, when an operating bias is applied across the device. The doping level of the layer 3 is of course set by the requirement that the sum of the energy acquired by the injected electrons in the depletion region, and the injector height h is of the order of $\Delta E$. The doping level and length of the transit region constituted by the layer 5 are chosen such that their product is greater than $10^{12} cm^{-2}$, the condition for domain formation, it being necessary that the electric field in the transit region is just sufficient to maintain the electron population of the higher conduction band.

It will also be appreciated that whilst the $Al_xGa_{1-x}As$/GaAs system described above is a particularly convenient system as $Al_xGa_{1-x}As$ is capable of being expitaxially grown on GaAs layers, the invention is applicable to devices employing other systems of materials, for example In Al As/In P, the materials being doped to the required levels with Si.

It will also be appreciated that whilst in the device described hereinbefore the charger transfer is by means of electrons, the invention is also applicable to devices in which the charge transfer is by means of holes. The appropriate regions within the device, will then be suitably p-doped, the necessary energy gap $\Delta E$ within the Gunn material being defined by appropriate valence bands.

We claim:

1. An electronic device comprising: a charge injection region and first and second regions of a Gunn effect material, said charge injection region having a graded gap injector, the composition of said charge injection region being the same as said first and second regions at its edge remote from said first and second regions, and varying in the direction toward said first region such that the direct band gap increases linearly with distance from said edge remote from said first and second regions, and so that it forms a heterojunction with said first region, said charge injection region being effective in use of the device to inject into said first region a charge of a predetermined energy which is less than the energy difference between the minima of the pair of energy band edges giving rise to the Gunn effect in said Gunn effect material, said first region having a thickness which is not more than the mean free electron path length in said first region, and being doped to an extent that in use of the device the sum of the depletion energy in said first region and said predetermined energy is in the order of said energy difference, said second region being doped to a lesser extent than said first region such that the electric field across the second region is sufficient for the formation and propagation of domains.

2. A device as claimed in claim 1, wherein said thickness is approximately 100 Å.

3. A device as claimed in claim 1, in which said first region is $n^+$ material.

4. A device according to claim 1, in which said Gunn effect material is GaAs.

* * * * *